United States Patent [19]

Nakagama et al.

[11] Patent Number: 5,096,740
[45] Date of Patent: Mar. 17, 1992

[54] PRODUCTION OF CUBIC BORON NITRIDE FILMS BY LASER DEPOSITION

[75] Inventors: Syoji Nakagama; Nobuhiko Fujita; Naohiro Toda; Akira Nakayama, all of Itami, Japan

[73] Assignee: Sumitomo Electric Industries, Ltd., Osaka, Japan

[21] Appl. No.: 644,586

[22] Filed: Jan. 23, 1991

[30] Foreign Application Priority Data

| Jan. 23, 1990 | [JP] | Japan | 2-11879 |
| Aug. 10, 1990 | [JP] | Japan | 2-210213 |
| Aug. 29, 1990 | [JP] | Japan | 2-225363 |
| Sep. 11, 1990 | [JP] | Japan | 2-238984 |
| Nov. 26, 1990 | [JP] | Japan | 2-317986 |

[51] Int. Cl.$^5$ .................................. B05D 3/06
[52] U.S. Cl. .................................. 427/53.1; 427/38; 427/39; 427/314; 427/50; 204/192.1
[58] Field of Search ............... 427/53.1, 38, 39, 54.1, 427/314, 50; 204/DIG. 11, 192.11, 192.1

[56] References Cited

U.S. PATENT DOCUMENTS

| 4,683,043 | 7/1987 | Melton et al. | 204/192.15 |
| 4,957,773 | 9/1990 | Spencer et al. | 427/39 |

FOREIGN PATENT DOCUMENTS

| 62-216225 | 9/1987 | Japan |
| 63-72875 | 4/1988 | Japan |
| 63-262457 | 10/1988 | Japan |

OTHER PUBLICATIONS

Biunno, et al. "Low-Temperature Processing of Titanium Nitride Films by Laser Physical Vapor Deposition", Appl. Phys. Lett., vol. 54, No. 16, 17th Apr. 1989, pp. 1519-1521.

Richter, et al., "Laser Plasma Deposition and Film Structure of Covalently Bound Materials", Journal of Non-Crystalline Solids, vols. 97+98, Part II, Dec., 1987, pp. 1443-1446.

Sato, et al., "Deposition of Diamond-like Carbon Films by Pulsed-Laser Evaporation", Japanese Journal of Applied Physics/Part 2: Letters, vol. 26, No. 9, Sep., 1987, pp. L1487-L1488.

Kessler, et al., "Laser Pulse Vapour Deposition of Polycrystalline Wurtzite-type BN", Thin Solid State, vol. 147, No. 1, 16th Feb., 1987, pp. L45-L50.

*Primary Examiner*—Shrive Beck
*Assistant Examiner*—Roy V. King
*Attorney, Agent, or Firm*—Cushman, Darby & Cushman

[57] ABSTRACT

A highly pure cubic boron nitride film is formed on a substrate by a method which comprises irradiating an excimer laser on a target comprising boron atoms and optionally nitrogen atom and depositing cubic boron nitride on a substrate which is placed to face the target.

13 Claims, 4 Drawing Sheets

PRODUCTION OF CUBIC BORON NITRIDE FILMS BY LASER DEPOSITION

BACKGROUND OF THE INVENTION

1. Field of the Invention

The present invention relates to a method for producing a boron nitride film, in particular, a cubic boron nitride film, which can be applied to a cemented carbide tool, an insulating film, a heat transfer film, a semiconductor, etc.

2. Description of the Related Art

For producing cubic boron nitride (hereinafter sometimes referred to as "c-BN"), following three methods are known:

1. A method comprising depositing boron on a substrate from a vapor source containing boron and simultaneously irradiating ion species containing at least nitrogen onto the substrate from a source for generating said species to produce a cubic boron nitride film on the substrate (see Japanese Patent Kokai Publication No. 181262/1985).

2. A method comprising chemically transporting boron by $H_2+N_2$ plasma to produce cubic boron nitride on a substrate (see J. Mat. Sci. Let., 4 (1985) 51-54).

3. A method comprising evaporating boron with a hollow cathode discharge gun (HCD gun) while ionizing nitrogen with a hollow electrode and irradiating ionized nitrogen onto a substrate on which radio frequency wave is applied to produce boron nitride on the substrate (see Inagawa et al, Proceedings of 9th Symposium on Ion Source Assisted Technology, '85, Tokyo, 299-302 (1985)).

However, it is difficult to produce cubic boron nitride having good crystallinity by the above conventional methods. That is, by the conventional methods, a single phase film consisting of c-BN is not produced, and the c-BN film contains hexagonal system boron nitride (hereinafter sometimes referred to as "h-BN") and/or amorphous boron nitride.

SUMMARY OF THE INVENTION

An object of the present invention is to provide a method for producing a cubic boron nitride film with high purity on a substrate.

According to a first aspect of the present invention, there is provided a method for producing a cubic boron nitride film on a substrate which method comprises irradiating an excimer laser on a target comprising boron atoms and nitrogen atoms and depositing cubic boron nitride on a substrate which is placed to face said target.

According to a second aspect of the present invention, there is provided a method for producing a cubic boron nitride film on a substrate which method comprises irradiating an excimer laser on a target comprising boron atoms and depositing cubic boron nitride on a substrate which is placed to face said target, wherein a discharge of a gas comprising a nitrogen atom is formed between said target and said substrate.

According to a third aspect of the present invention, there is provided a method for producing a cubic boron nitride film on a substrate which method comprises irradiating an excimer laser on a target comprising boron atoms and depositing cubic boron nitride on a substrate which is placed to face said target, wherein nitrogen ions are irradiated on a surface of said substrate on which cubic boron nitride is formed.

According to a fourth aspect of the present invention, there is provided a method for producing a cubic boron nitride film on a substrate which method comprises irradiating an excimer laser on a target comprising boron atoms in an atmosphere containing a gas comprising a nitrogen atoms and depositing cubic boron nitride on a substrate which is placed to face said target, wherein a heated filament is provided between said target and said substrate.

According to a fifth aspect of the present invention, there is provided a method for producing a cubic boron nitride film on a substrate which method comprises irradiating an excimer laser on a target comprising boron atoms in an atmosphere containing a gas comprising a nitrogen atoms and depositing cubic boron nitride on a substrate which is placed to face said target, wherein a heated filament is provided between said target and said substrate and a negative direct current voltage or a radio frequency voltage is applied to said filament.

Preferably, in the methods of the fourth and fifth aspects, a gas comprising at least one element selected from the group consisting of hydrogen, fluorine and rare-gas elements is supplied between the target and the substrate. Further, the target preferably contains hydrogen atoms and/or fluorine atoms.

DETAILED DESCRIPTION OF THE INVENTION

The first method of the present invention will be explained by making reference to FIG. 1.

Figure 1:
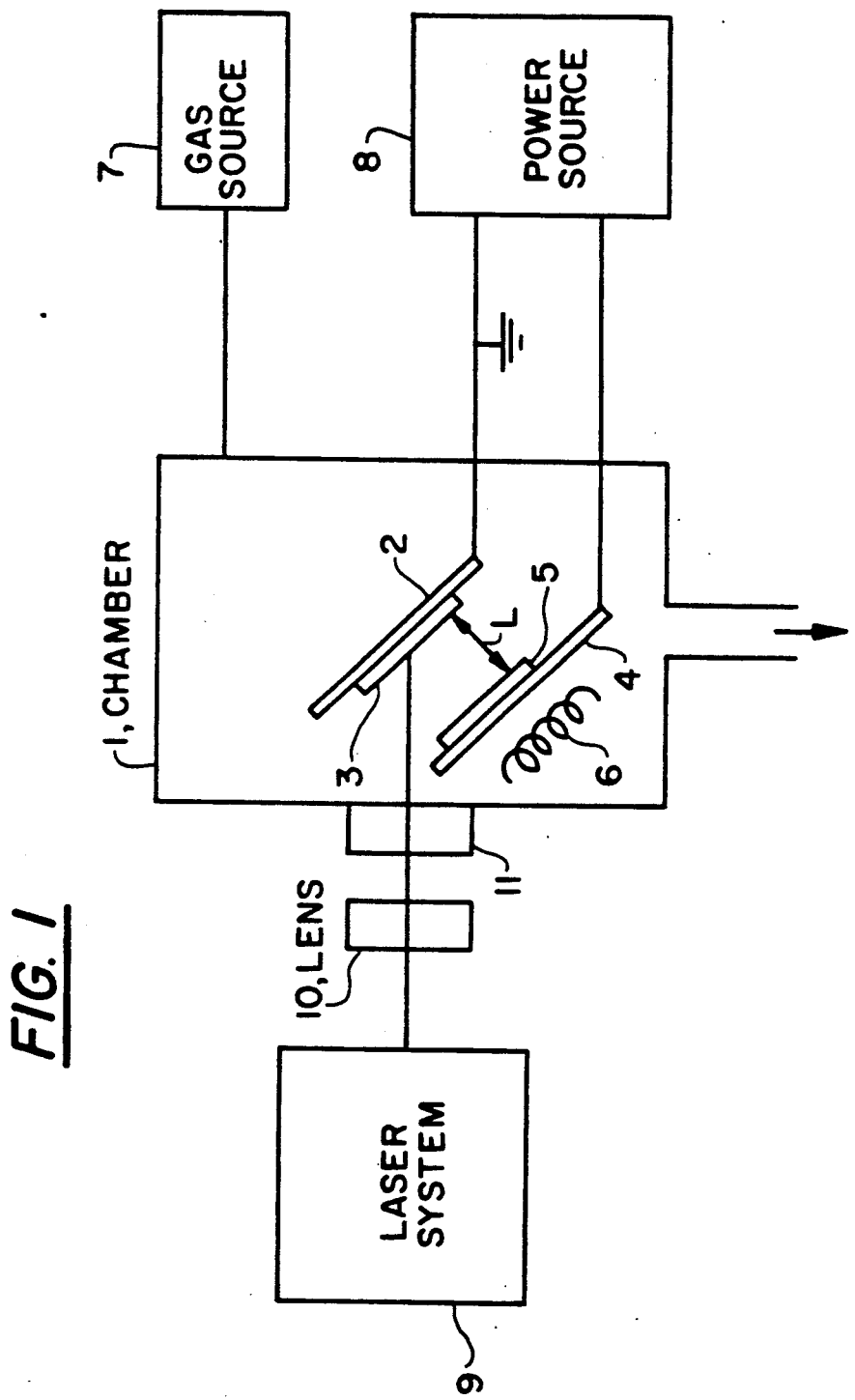
FIGS. 1, 2, 3 and 4 schematically show examples of apparatuses to be used for carrying out the methods of the present invention.

The apparatus of FIG. 1 comprises a deposition chamber 1. In the chamber, there are a target 3 placed on a target holder 2, and a substrate 5 placed on a substrate holder 4 with facing the target 3. A distance L between the target 3 and the substrate 5 is usually from 10 to 150 mm.

As the target 3, h-BN, pyrolytic boron nitride (hereinafter sometimes referred to as "p-BN"), a single crystal or polycrystal of c-BN may be used.

The substrate 5 is heated at a temperature of 300° to 1300° C. with a heater 6.

A laser beam is generated by an excimer laser system 9, focused with a focusing lens 10 in order to increase a laser power density and irradiated on the surface of the target 3 in the chamber through an entrance window 11.

A laser power density on the surface of the target 3 is usually in the range from 0.5 to 20 $J/cm^2$.

When the laser power density is smaller than 0.5 $J/cm^2$, the film growing rate becomes small and the target is not sufficiently excited so that the c-BN film is not formed. When the laser power density is larger than 20 $J/cm^2$, many clusters are formed so that the c-BN film having good quality is not formed. By the film growth in the nitrogen-containing atmosphere, it is possible to reach a B/N ratio in the film to the stoichiometric ratio, namely 1:1.

The excimer laser has an oscillation wavelength in the ultraviolet range of from 193 to 350 nm and is generated from ArF, KrF, KCl, XeF, XeCl, etc.

One of the reasons why the excimer laser is used in the present invention is that each photon has a larger energy. For example, in case of the ArF excimer laser, it has the oscillation wavelength of 193 nm, which corresponds to 6.42 eV. On the contrary, in case of the $CO_2$ laser which is technically used, it has the oscillation wavelength of 10.6 μm, which corresponds to 0.12 eV at most.

Next reason is that the laser beam can be converged with an optical system such as a focusing lens, whereby the energy density is increased. By the application of the high energy laser beam on the target, a compound of the target is decomposed to generate excited species (so-called "plume") and boron nitride is synthesized.

Into the chamber 1, a gas comprising nitrogen atoms (e.g. $N_2$, $NH_3$, etc.) is supplied from a gas supplying unit 7. The pressure in the chamber 1 is kept in a range from 0.001 to 10 Torr. The gas in the chamber is exhausted from an outlet.

When the pressure is lower than 0.001 Torr., the nitrogen atoms are not trapped in the grown film so that the boron-rich BN film is produced. When the pressure is higher than 10 Torr., a length of emission of the excited species generated by the excimer laser from the target towards the substrate becomes short so that it is difficult to synthesize boron nitride and thus the film growth rate becomes very small.

An incident angle of the laser beam on the target is not critical. In the present invention, it is preferably 45°±20° from the surface plane of the target.

A distance L between the target and the substrate may be one of important parameters in the film deposition. Though this distance depends on other process conditions, it is usually from 10 to 150 mm. When the distance is shorter than 10 mm, the film deposition rate becomes high so that an amount of boron in the film increases. When the distance is longer than 150 mm, the excited species tend not to reach the substrate so that the film deposition rate decreases to an unpractical level.

The above parameters such as the laser power, the pressure and the distance between the target and the substrate are mutually related to control the gas phase reaction in the chamber.

The substrate is heated at a temperature of 300° to 1300° C. with a heater 6. When the substrate temperature is lower than 300° C., the particles which reach the film growth surface are not sufficiently migrated so that the content of the amorphous component may increase. When the substrate temperature exceeds 1300° C., the content of hexagonal system component may increase and there are a few materials that can be beared with 1300° C., so it is not practically used.

A kind of the substrate to be used in the method of the present invention can be selected according to the final use. Examples of the substrate material are Si, diamond, Mo, WC, iron and ceramics such as $Si_3N_4$.

In the second method of the present invention, a nitrogen-containing gas is supplied from a gas source 7, and discharge is generated between the target 3 and the substrate 5 as shown in FIG. 1.

To generate discharge, voltage is applied between the target 3 and the substrate 5 with a DC, RF or microwave power source 8. Other conditions are substantially the same as in the first method except that the pressure in the chamber 1 can be kept in a range between $10^{-5}$ to 10 Torr. Outside this range, the generation of discharge may be difficult.

By the generation of discharge between the target and the substrate, ions or radicals comprising the nitrogen atoms are formed and contribute to the production of the cubic boron nitride having good quality.

Preferably, a negative bias is applied to the substrate or the substrate holder, whereby the effect of the discharge is enhanced. The bias may be DC or RF self-bias.

The discharge generation and bias application can be done with the same means.

Since the nitrogen-containing gas is supplied, the target does not necessarily contain the nitrogen atoms and may be single substance boron or $H_3BO_3$.

Figure 2:
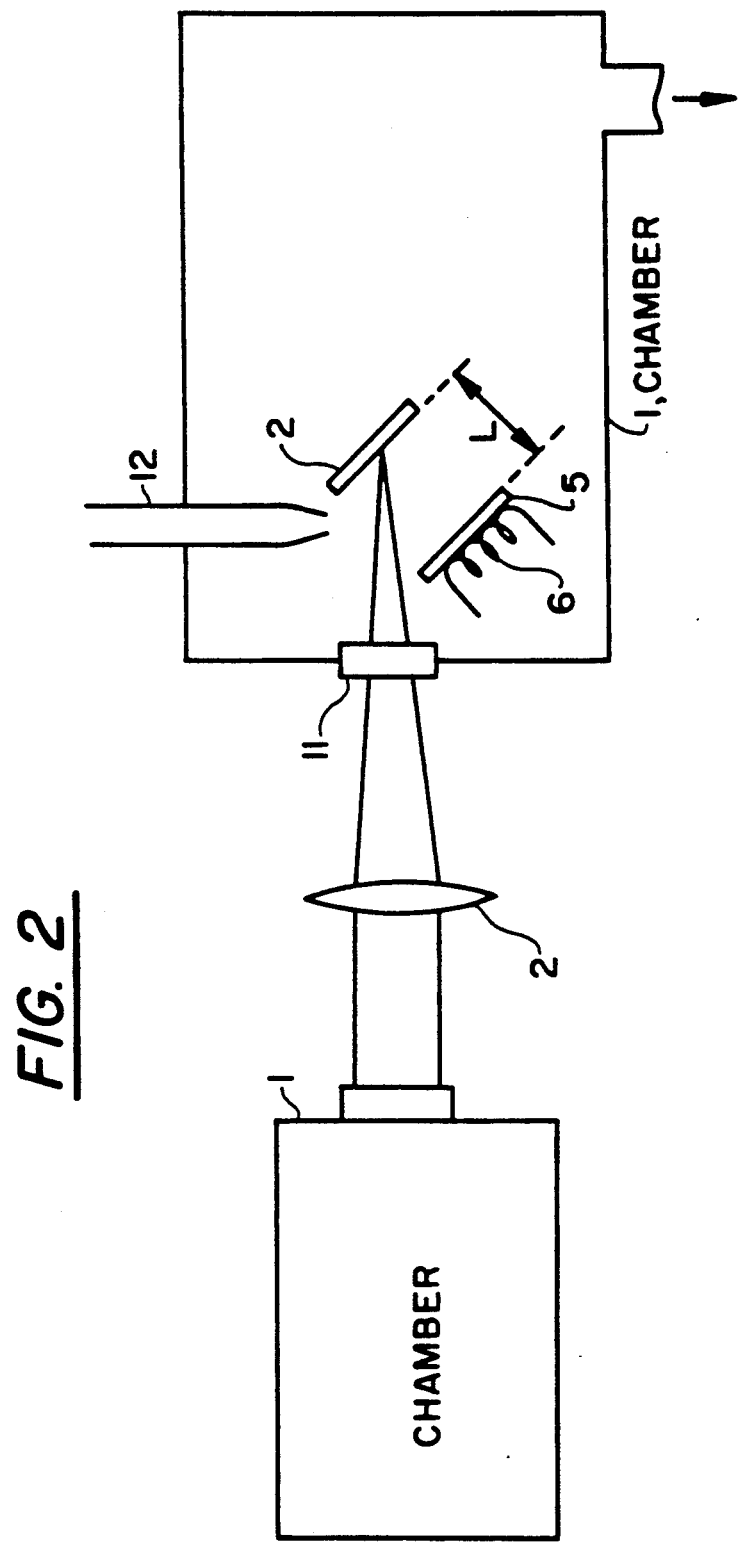

In the third method of the present invention, the nitrogen ions are supplied from a nozzle 12 towards the substrate 5 as shown in FIG. 2.

The nitrogen ions are generated by plasma such as RF plasma or microwave plasma, or a nitrogen ion beam is directly irradiated.

An energy and an amount (i.e. density) of the nitrogen ions depend on the introduction method of the ions or other process conditions. In case of ion beam, an energy of several KeV or less, for example 6 to 7 KeV or less is preferred. In case of ionization with plasma, the energy is preferably from several eV to several ten eV, for example, 5 to 60 eV.

The amount of the nitrogen ion is so selected that the B/N ratio in the grown BN film is around 1:1.

Other conditions are substantially the same as in the second method.

Figure 3:
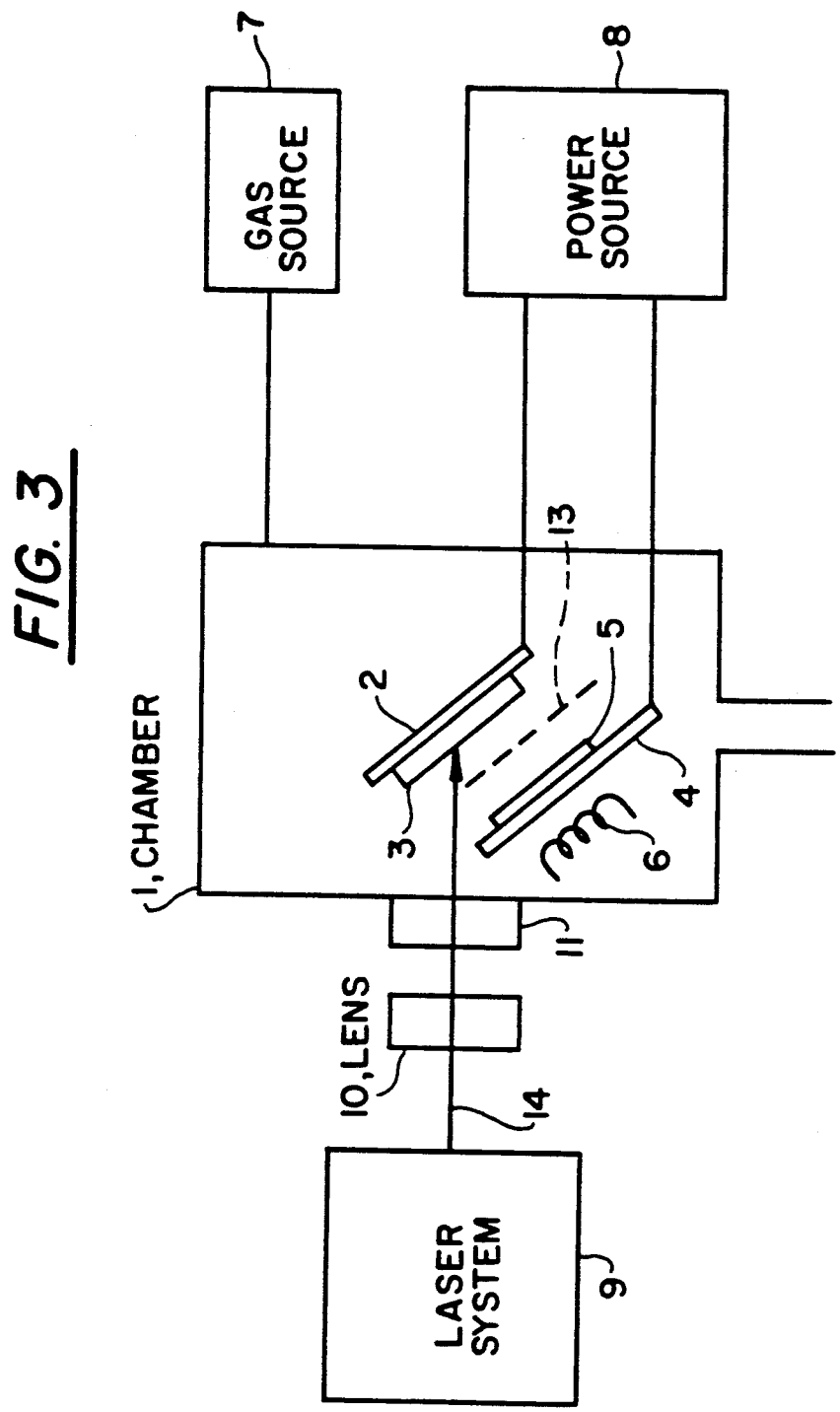

In the fourth method of the present invention, a filament 13 is provided between the target 3 and the substrate 5 as shown in FIG. 3. The filament may be made of tungsten (W), tantalum (Ta), etc. and is heated with a filament heating unit.

The substrate is heated at a temperature of 300° to 1300° C. with a heater 6 or the filament 13.

Into the chamber 1, a gas comprising nitrogen atoms (e.g. $N_2$, $NH_3$, etc.), a gas comprising hydrogen atoms or fluorine atoms (e.g. $H_2$, $F_2$, $CF_4$, etc.) or a rare gas (e.g. He, Ar, etc.) is supplied from a gas supplying unit 7.

The pressure during deposition of the boron nitride film in this method is generally from $10^{-5}$ to 10 Torr.

A laser beam 14 is generated by the same manner as above.

In this embodiment of the present invention, the filament 13 is provided between the target 3 and the substrate 5 and heated at a temperature of from 1700° to 2300° C. to generate heat which further excites the plume, whereby the crystallinity of the synthesized c-B is increased.

At a temperature higher than 1700° C., since equilibrium pressures of many materials become high, components of the filament are trapped in the synthesized film so that the film comprises c-BN and the components of the filament.

By the supply of the gas containing hydrogen and/or fluorine atoms or by using the target comprising the hydrogen and/or fluorine atoms, a gas comprising hydrogen and/or fluorine atoms is supplied in the chamber atmosphere. Then, such gas is heated by the filament, so that radicals of hydrogen, fluorine and/or HF are generated and have some advantageous influence on the synthesis of high pure c-BN.

Preferably, a negative bias is applied to the substrate or the substrate holder, whereby the effect of the discharge is enhanced. The bias may be DC or RF self-bias.

When the gas comprising the rare-gas element such as Ar or He, the rare-gas element is ionized with the thermions from the filament and contributes to the synthesis of high quality c-BN.

A distance between the target and the filament is preferably from 5 to 30 mm.

In the fifth method of the present invention, a negative DC bias of not higher than 250 V or RF bias is further applied to the filament 13 with a DC or RF power source 8' so as to emit thermoelectrons effectively. Other conditions can be the same as those in the fourth method.

In the fifth method, the filament is preferably heated at a temperature of from 500° to 1700° C. At a temperature lower than 500° C., hydrogen atoms are less generated. In addition, since only very few thermoelectrons are emitted, the effects of the present invention are not advantageously achieved. Though the c-BN film can be formed at a temperature higher than 1700° C., the components of the filament tend to be included in the BN film.

The negative DC bias applied to the filament is preferably not higher than 250 V. When it is higher than 250 V, the filament material is spattered so that the components of the filament are included in the deposited c-BN film.

The RF bias applied to the filament has a power of not larger than 500 W. When it is larger than 500 W, the filament material is spattered so that the components of the filament are included in the deposited c-BN film.

When the DC bias or the RF bias is applied to the heated filament, the thermoelectrons are effectively emitted from the filament and excite the plumes which are liberated from the target by the laser beam irradiation. Since more thermoelectrons are emitted by the DC or RF bias application than by the mere heating of the target with the filament, the boron nitride film can be deposited at a temperature at which the vapor pressure of the filament component is negligibly low. Thereby, the synthesized c-BN film is highly pure.

In all of the methods of the present invention, a frequency of laser pulse is not critical. Preferably, it is larger than 200 Hz. When it is larger than 200 Hz, not only the irradiation energy of the generated excimer laser is decreased but also the target is always in the heated state. The heated target is molten and drops of molted targets are splashed by irradiation pressure of the excimer laser, so that the deposited film contains much amorphous or hexagonal boron nitride which is formed from the liquid phase. Such film containing amorphous or hexagonal boron nitride may not be practically used.

PREFERRED EMBODIMENTS OF THE INVENTION

The present invention will be explained by following Examples, which do not limit the scope of the present invention.

EXAMPLE 1

Dependency on the laser power

By using the apparatus of FIG. 1 having no power source 8, a c-BN film was produced with varying the laser power according to the present invention.

As the laser, ArF excimer laser was used, as the substrate, a silicon wafer was used and as the target, c-BN polycrystal was used. An angle between the laser beam and the surface of the target was kept at 45°. The frequency of laser pulse was 1 Hz.

In the chamber, nitrogen gas was supplied at 50 sccm to keep pressure at 0.5 Torr.

The distance between the target and the substrate was 40 mm, and the substrate temperature was 800° C.

Under the above conditions, the film was grown for one hour.

The formed film was analyzed by X-ray diffraction (CuKα) to determine the film quality. The results are shown in Table 1.

TABLE 1

| Sample No. | Laser power (J/cm$^2$) | Results of X-ray diffraction |
|---|---|---|
| 1 | 0.3 | Not evaluated*[1] |
| 2 | 0.5 | c-BN |
| 3 | 1.0 | c-BN |
| 4 | 2.0 | c-BN |
| 5 | 5.0 | c-BN |
| 6 | 10.0 | c-BN |
| 7 | 15.0 | c-BN |
| 8 | 20.0 | c-BN |
| 9 | 30.0 | c-BN with h-BN |
| 10 | 50.0 | h-BN |

Note:
*[1]Too thin film to be measured.

In the laser power range between 0.5 and 20 J/cm$^2$, the c-BN film was formed.

EXAMPLE 2

Dependency on the film growing pressure

With varying the pressure in the chamber, a c-BN film was grown. As the target, a h-BN sintered material was used, and NH$_3$ gas was supplied in the chamber at 30 sccm. The laser power was 20 J/cm$^2$. Other conditions were the same as in Example 1. The results are shown in Table 2.

TABLE 2

| Sample No. | Pressure (Torr) | Results of X-ray diffraction | Remarks |
|---|---|---|---|
| 11 | $1 \times 10^{-4}$ | h-BN (broad peak) | Boron rich |
| 12 | $5 \times 10^{-4}$ | h-BN (broad peak) | Boron rich |
| 13 | 0.001 | c-BN | |
| 14 | 0.003 | c-BN | |
| 15 | 0.01 | c-BN | |
| 16 | 0.5 | c-BN | |
| 17 | 1.0 | c-BN | |
| 18 | 5.0 | c-BN | |
| 19 | 10.0 | c-BN | |
| 20 | 20.0 | Not evaluated*[1] | |

Note:
*[1]Too thin film to be measured.

As understood from the results of Table 2, at a pressure of $5 \times 10^{-4}$ Torr or lower, the content of nitrogen in the grown films of Sample Nos. 11 and 12 decreased and the film consisted of h-BN having poor crystallinity.

At the pressure of 20.0 Torr., the film thickness was too thin and the film property was not measured.

In the presence range from 0.001 to 10 Torr., the good c-BN films were grown.

EXAMPLE 3

Dependency on the target-substrate distance

In the same manner as in Example 2 but using a c-BN polycrystal as a substrate and a pressure of 0.5 Torr.

while varying a distance L between the target and the substrate, a BN film was grown. The results are shown in Table 3.

TABLE 3

| Sample No. | Distance L (mm) | Results of X-ray diffraction |
|---|---|---|
| 21 | 5 | h-BN (boron rich) |
| 22 | 10 | c-BN |
| 23 | 20 | c-BN |
| 24 | 30 | c-BN |
| 25 | 50 | c-BN |
| 26 | 100 | c-BN |
| 27 | 120 | c-BN |
| 28 | 150 | c-BN |
| 29 | 180 | Not evaluated*1 |

Note:
*1 Too thin film to be measured.

As understood from the results of Table 3, at a distance L in the range between 10 to 150 mm, a c-BN film with good quality was produced. At a distance L of 5 mm or shorter, a boron rich h-BN film having a low density was formed, while at a distance L of 180 mm or longer, a formed film was too thin to measure the film properties.

EXAMPLE 4

Dependency on the substrate temperature

In the same manner as in Example 3 but using a c-BN single crystal as a target and fixing a distance between the target and the substrate at 30 mm with varying a substrate temperature, a BN film was grown. The results are shown in Table 4.

TABLE 4

| Sample No. | Substrate temp. (°C.) | Results of X-ray diffraction |
|---|---|---|
| 30 | 150 | Amorphous (i-BN) |
| 31 | 200 | Amorphous (i-BN) |
| 32 | 250 | Amorphous (i-BN) |
| 33 | 300 | c-BN |
| 34 | 400 | c-BN |
| 35 | 500 | c-BN |
| 36 | 650 | c-BN |
| 37 | 800 | c-BN |
| 38 | 1000 | c-BN |
| 39 | 1300 | h-BN |
| 40 | 1500 | The Si substrate was molten. |

As understood from the results of Table 4, the c-BN film with good quality was formed in the substrate temperature range between 300° C. and 1300° C.

When a BN film was tried to be grown with using Mo as a substrate at 1500° C., the formed BN was h-BN.

EXAMPLE 5

Dependency on the substrate material

In the same manner as in Example 4 but fixing the substrate temperature at 800° C. with varying a kind of the substrate material, a BN film was grown. The results are shown in Table 5.

TABLE 5

| Sample No. | Substrate material | Results of X-ray diffraction |
|---|---|---|
| 41 | Mo | c-BN |
| 42 | WC | c-BN |
| 43 | Single crystal diamond | c-BN |
| 44 | Polycrystal diamond | c-BN |
| 45 | Single crystal c-BN | c-BN |
| 46 | Sapphire | c-BN |

Not only on the c-BN substrate but also on various substrates such as Mo, WC, diamond and sapphire, the c-BN film could be formed according to the present invention.

EXAMPLE 6 AND COMPARATIVE EXAMPLE 1

By using the apparatus of FIG. 1, a cubic boron nitride film was produced on a silicon substrate under the following conditions:

Excimer laser: ArF (193 nm)
Gas: $N_2$ (10 mTorr.)
Substrate: Silicon
Distance between target and substrate: 45 mm
Substrate temperature: 650° C.
Power source for discharge: RF (13.56 MHz)

Table 6 shows other film deposition conditions and also results of film thickness measurement with a scanning electron microscope, X-ray diffraction analysis (a half width of 111 diffraction peak of c-BN) ($2\theta$ degree), a ratio of c-BN peak to h-BN peak from IR spectrum and a composition determined by electron spectroscopy for chemical analysis.

In Comparative Example 1, the IVD (ion vapor deposition) method disclosed in Japanese Patent Kokai Publication No. 181262/1985 was repeated. This method comprises depositing boron on the substrate from the vapor source containing boron and simultaneously irradiating ion species containing at least nitrogen onto the substrate from the source for generating said species to produce cubic boron nitride. In this method, the ion acceleration energy is selected to be 5 to 100 keV per one atom of the ion species, and the deposition and irradiation are carried out in an atmosphere of nitrogen or a nitrogen-containing compound which is activated to an energy level lower than the ion specifies.

The conditions in Comparative Example 1 were as follows:

Vapor source: Boron
$N_2+$ acceleration energy: 35 keV
Pressure of $N_2$ atmosphere: $3 \times 10^{-5}$ Torr.
Substrate: Silicon
Substrate temperature: 200° C.
A negative bias was applied to the substrate.

TABLE 6

| Sample No. | Target | Gas | RF power (W) | Laser power (J/cm²) | Half width in X-ray diffraction pattern (deg.) | c-BN/h-BN ratio | B/N ratio |
|---|---|---|---|---|---|---|---|
| 51 | h-BN | $N_2$ | 0 | 1 | 2.0 | 3 | 1.3/1 |
| 52 | h-BN | $N_2$ | 10 | 1 | 1.7 | 7 | 1.2/1 |
| 53 | h-BN | $N_2$ | 50 | 1 | 1.0 | *1 | 1.1/1 |
| 54 | h-BN | $N_2$ | 100 | 1 | 0.8 | *1 | 1/1 |
| 55 | h-BN | $N_2$ | 500 | 1 | 0.9 | *1 | 1/1.1 |
| 56 | h-BN | $N_2$ | 1000 | 1 | — | — | — |
| 57 | c-BN | $N_2$ | 100 | 1 | 0.9 | *1 | 1/1 |
| 58 | B | $N_2$ | 100 | 1 | 1.0 | *1 | 1.1/1 |

TABLE 6-continued

| Sample No. | Target | Gas | RF power (W) | Laser power (J/cm$^2$) | Half width in X-ray diffraction pattern (deg.) | c-BN/h-BN ratio | B/N ratio |
|---|---|---|---|---|---|---|---|
| 59 | h-BN | NH$_3$ | 100 | 1 | 0.8 | *1 | 1/1.1 |
| 60 | h-BN | N$_2$ + H$_2$ | 100 | 1 | 0.9 | *1 | 1.1/1 |
| 61 | h-BN | N$_2$ | 100 | 0.5 | 1.3 | *1 | 1/1.2 |
| 62 | h-BN | N$_2$ | 100 | 20 | 1.2 | *1 | 1.1/1 |
| Comp. Ex. 1 | B | N$_2^+$ | — | — | 3.0 | 5 | 1.4/1 |

Note:
*1 Infinite (no h-BN).

The Sample No. 56 could not be evaluated because of too thin film thickness.

As understood from the results of Table 6, preferably the RF power is from 10 W to 1 KW, in particular from 50 to 500 W.

EXAMPLE 7

By using the apparatus of FIG. 2, a cubic boron nitride film was produced on a silicon substrate under the conditions shown in Table 7. The distance between the target and the substrate was 60 mm except that it was 5 mm, 50 mm or 200 mm in the Sample No. 90, 91 or 92.

The thickness of each grown film was from 1000 to 2000 Å.

The results are also shown in Table 7, in which "MW plasma" stands for "microwave plasma".

In the Sample Nos. 71 to 75, the dependency on the laser power was examined. In the power range from 0.5 to 20 J/cm$^2$, good c-BN films were produced. In the Sample Nos. 76 and 78 to 81, the target material was changed, in the Sample Nos. 85 to 89, the pressure was changed, in the Sample Nos. 90 to 92, the distance between the target and the sample was changed, and in the Sample Nos. 93 to 96, the substrate temperature was changed.

EXAMPLE 8 AND COMPARATIVE EXAMPLES 2 AND 3

By using the apparatus of FIG. 3, a cubic boron nitride film was produced on a silicon substrate under the following conditions:

Excimer laser: ArF (193 nm)
Laser power: 2 J/cm$^2$
Target: p-BN, BH$_3$BH$_3$, B
Gases: N$_2$, NH$_3$, H$_2$, F$_2$, CF$_4$, etc.
Gas pressure: 10 mTorr.
Substrate: Silicon
Distance between target and substrate: 45 mm
Substrate temperature: 650° C.
Filament: W-Re
Filament temperature: 1850° C.
Distance between substrate and filament: 10 mm.

In Comparative Example 2, the filament was not heated.

Table 8 shows other film deposition conditions and also results of X-ray diffraction analysis (a half width of (111) diffraction peak of c-BN) (2θ degree), a ratio of c-BN peak to h-BN peak from IR spectrum and a composition determined by electron spectroscopy for chemical analysis.

TABLE 7

| Sample No. | Target | Laser power (J/cm$^2$) | Pressure (Torr.) | Introduction of N ions (condition) | Substrate temp. (°C.) | Results of X-ray diffraction |
|---|---|---|---|---|---|---|
| 71 | c-BN | 30 | 1.0 | RF plasma (400 W) | 600 | c-BN/h-BN mixture |
| 72 | c-BN | 20 | 1.0 | RF plasma (400 W) | 600 | c-BN |
| 73 | c-BN | 3 | 1.0 | RF plasma (400 W) | 600 | c-BN |
| 74 | c-BN | 0.5 | 1.0 | RF plasma (400 W) | 600 | c-BN |
| 75 | c-BN | 0.1 | 1.0 | RF plasma (400 W) | 600 | Not evaluated*1 |
| 76 | c-BN | 3 | 1.0 | MW plasma (200 W) | 600 | c-BN |
| 77 | c-BN | 3 | 1 × 10$^{-5}$ | N ion beam (3 keV) | 500 | c-BN |
| 78 | h-BN | 3 | 1.0 | MW plasma (200 W) | 600 | c-BN |
| 79 | w-BN | 3 | 1.0 | MW plasma (200 W) | 600 | c-BN |
| 80 | p-BN | 3 | 1.0 | MW plasma (200 W) | 600 | c-BN |
| 81 | Boron | 3 | 1.0 | MW plasma (400 W) | 600 | c-BN |
| 82 | Boron | 3 | 0.1 | MW plasma (400 W) | 600 | c-BN |
| 83 | Boron | 10 | 1.0 | MW plasma (400 W) | 600 | c-BN |
| 84 | Boron | 3 | 0.1 | MW plasma (400 W) | Room temp. | c-BN |
| 85 | h-BN | 3 | 0.1 | RF plasma (400 W) | 600 | c-BN |
| 86 | h-BN | 3 | 5.0 | RF plasma (400 W) | 600 | c-BN |
| 87 | h-BN | 3 | 10.0 | RF plasma (400 W) | 600 | c-BN |
| 88 | h-BN | 3 | 20.0 | RF plasma (400 W) | 600 | c-BN |
| 89 | h-BN | 3 | 0.001 | RF plasma (400 W) | 600 | c-BN |
| 90 | c-BN | 3 | 0.01 | MW plasma (200 W) | 600 | No film grown |
| 91 | c-BN | 3 | 0.01 | MW plasma (200 W) | 600 | No discharge |
| 92 | c-BN | 3 | 0.01 | MW plasma (200 W) | 600 | No film bad crystallinity |
| 93 | c-BN | 3 | 1.0 | — | Room temp. | Amorphous BN |
| 94 | c-BN | 3 | 1 × 10$^{-5}$ | N ion beam (3 keV) | Room temp. | c-BN with poor crystallinity |
| 95 | c-BN | 3 | 1 × 10$^{-5}$ | N ion beam (3 keV) | 1300 | c-BN |
| 96 | c-BN | 3 | 1 × 10$^{-5}$ | N ion beam (3 keV) | 1500 | Si substrate molten |

Note:
*1 Too thin film to be measured.

In Comparative Example 3, the IVD (ion vapor deposition) method disclosed in Japanese Patent Kokai Publication No. 181262/1985 was repeated under the following conditions:
Vapor source: Boron
$N_2+$ acceleration energy: 15 keV
Pressure of $N_2$ atmosphere: $4 \times 10^{-5}$ Torr.
Substrate: Silicon
Substrate temperature: 400° C.

TABLE 8

| Sample No. | Target | Gasses (vol %) | Half width (deg.) | c-BN/ h-BN ratio | B/N ratio |
|---|---|---|---|---|---|
| 101 | p-BN | $N_2$, $H_2$ | 1.9 | *1 | 1/1 |
| 102 | p-BN | $NH_3$, $H_2$ | 1.8 | *1 | 1/1.1 |
| 103 | p-BN | $N_2$, $F_2$ | 1.8 | *1 | 1/1.05 |
| 104 | p-BN | $NH_3$, $H_2$, $F_2$ | 1.7 | *1 | 1.1/1 |
| 105 | p-BN | $N_2$, $H_2$, $CF_4$ | 1.8 | *1 | 1/1 |
| 106 | $BH_3NH_3$ | $N_2$, $NH_3$ | 1.9 | *1 | 1/1 |
| Comp. Ex. 2 | p-BN | $N_2$ | 2.5 | 3 | 1.3/1 |
| Comp. Ex. 3 | B | $N_2$ ions | 2.3 | 5 | 1.4/1 |

Note:
*1Infinite (no h-BN).

EXAMPLES 9 AND COMPARATIVE EXAMPLES 4–8

Figure 4:
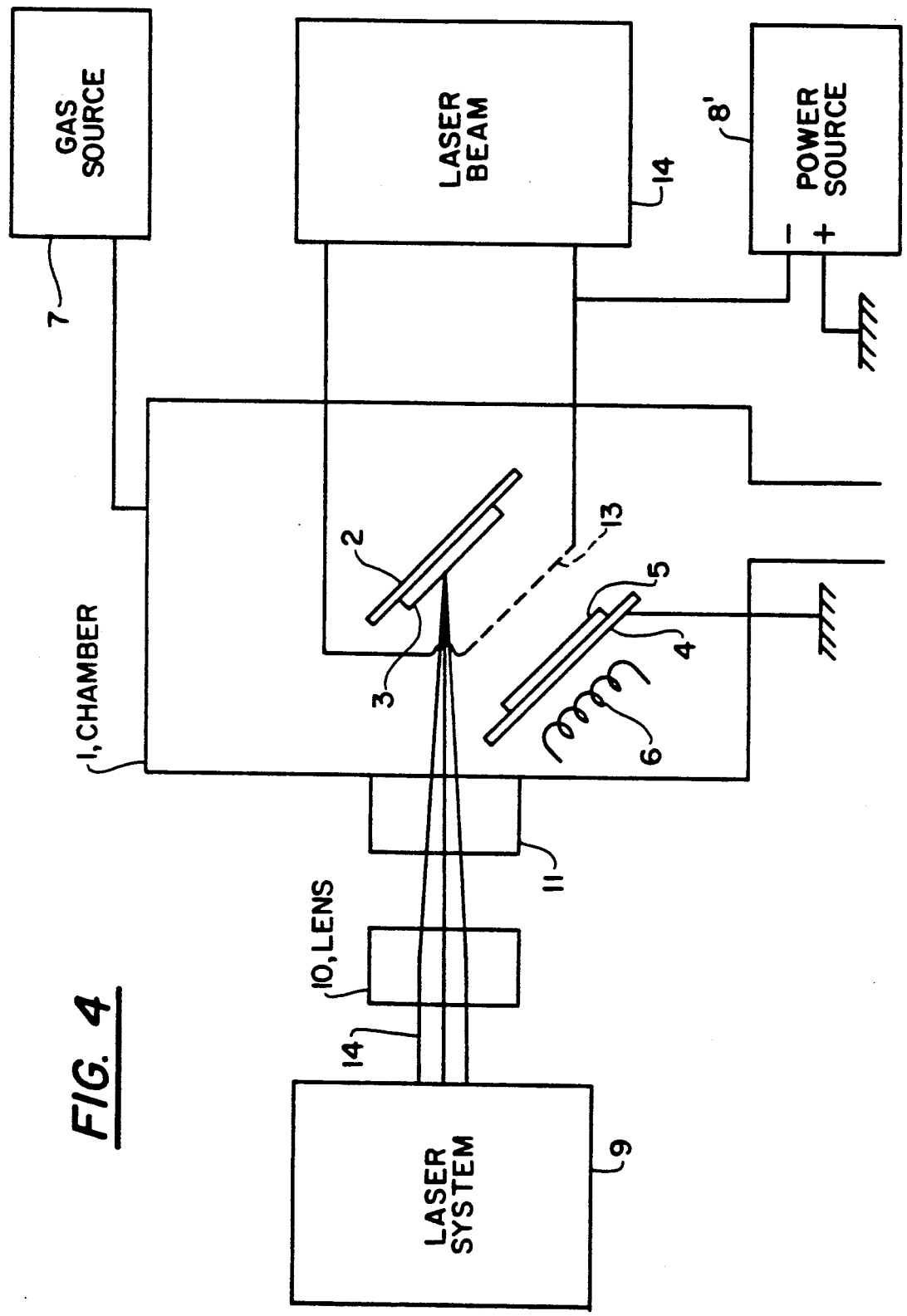

By using the apparatus of FIG. 4, a cubic boron nitride film was produced on a silicon substrate under the following conditions:
Excimer laser: ArF (193 nm)
Laser power: 2 J/cm$^2$
Frequency of laser pulse: 1 Hz
Number of irradiated pulses: 1000 times
Target: p-Bn, B, $H_3BO_3$, $KBF_4$
Gases: $N_2$, $NH_3$, $H_2$, $F_2$, He
Gas pressure: 10 mTorr.
Substrate: Silicon
Distance between target and substrate: 45 mm
Substrate temperature: 650° C.
Bias:
 −50 V (DC)
 −100 V (RF)
Filament: tungsten (W)
Distance between substrate and filament: 10 mm Table 9 shows other film deposition conditions and also results of film thickness measurement with a scanning electron microscope, X-ray diffraction analysis (a half of 111 diffraction peak of c-BN (28 degree), a ratio of c-BN peak to h-BN peak from IR spectrum and a composition determined by electron spectroscopy for chemical analysis.

In Comparative Examples 4 and 5, the filament was not heated or no bias was applied to the filament. In Comparative Example 6, the filament was heated but no bias was applied. In Comparative Examples 7 and 8, the filament was not heated but the bias was applied to the filament.

The results are shown in Table 9 together with those of Comparative Example 3.

TABLE 9

| Sample No. | Target | Gasses (vol %) | Bias | Filament temp. (°C.) | Film thickness (μm) | Half width 2θ (deg.) | c-BN/ h-BN ratio | Composition B/N ratio | W (%) |
|---|---|---|---|---|---|---|---|---|---|
| 111 | p-BN | $N_2$ (100) | DC | 1500 | 0.3 | 2.0 | *1 | 1.0 | 0 |
| 112 | p-BN | $N_2$ (30), $H_2$ (70) | DC | 1500 | 0.2 | 1.8 | *1 | 1.1 | 0 |
| 113 | p-BN | $NH_3$ (50), $H_2$ (50) | DC | 1500 | 0.2 | 1.7 | *1 | 1.0 | 0 |
| 114 | p-BN | $N_2$ (20), $H_2$ (80) | RF | 1500 | 0.3 | 1.9 | *1 | 1.0 | 0 |
| 115 | p-BN | $NH_3$ (70), $F_2$ (30) | RF | 1500 | 0.2 | 1.7 | *1 | 1.1 | 0 |
| 116 | p-BN | $N_2$ (20), He (80) | DC | 1500 | 0.2 | 1.8 | *1 | 1.1 | 0 |
| 117 | p-BN | $N_2$ (20), $F_2$ (40), He (40) | RF | 1500 | 0.3 | 1.8 | *1 | 1.1 | 0 |
| 118 | p-BN | $NH_3$ (100) | RF | 1000 | 0.3 | 2.0 | *1 | 1.0 | 0 |
| 119 | p-BN | $N_2$ (20), $H_2$ (40), He (40) | DC | 1000 | 0.2 | 1.8 | *1 | 1.1 | 0 |
| 120 | B | $N_2$ (100) | DC | 1500 | 0.5 | 2.1 | *1 | 1.4 | 0 |
| 121 | B | $NH_3$ (70), $H_2$ (30) | DC | 1500 | 0.4 | 2.0 | *1 | 1.4 | 0 |
| 122 | $H_3BO_3$ | $N_2$ (80), He (20) | DC | 1500 | 0.5 | 1.9 | *1 | 1.2 | 0 |
| 123 | $H_3BO_3$ | $N_2$ (70), $F_2$ (30) | RF | 1500 | 0.5 | 1.9 | *1 | 1.1 | 0 |
| 124 | $KBF_4$ | $N_2$ (40), $NH_3$ (40), He (20) | DC | 1500 | 0.4 | 1.8 | *1 | 1.2 | 0 |
| Com. 4 | p-BN | $N_2$ (100) | — | — | 0.5 | 2.5 | 3 | 1.3 | 0 |
| Com. 5 | p-BN | $NH_3$ (50), $H_2$ (50) | — | — | 0.3 | 3.0 | 5 | 1.3 | 0 |
| Com. 6 | p-BN | $N_2$ (30), $H_2$ (70) | — | 1850 | 0.2 | 1.9 | *1 | 1.0 | 12 |
| Com. 7 | p-BN | $N_2$ (20), $H_2$ (80) | DC | — | 0.3 | 2.4 | 8 | 1.0 | 0 |
| Com. 8 | p-BN | $NH_3$ (100) | RF | — | 0.2 | 2.6 | 10 | 1.2 | 0 |
| Com. 3 | B | $N_2$ ions | — | — | 0.1 | 2.3 | 5 | 1.4 | 0 |

Note:
*1Infinite (no h-BN).

What is claimed is:

1. A method for producing a cubic boron nitride film on a substrate comprising
   irradiating an excimer laser on a target comprising boron atoms and nitrogen atoms to deposit cubic boron nitride on said substrate facing said target.
   wherein said substrate is at a temperature of from 300° to 1300° C. and said laser has a power density of from 0.5 to 20 J/cm$^2$.

2. The method according to claim 1, wherein a deposition pressure is from 0.001 to 10 Torr.

3. A method for producing a cubic boron nitride film on a substrate comprising
   irradiating an excimer laser on a target comprising boron atoms to deposit cubic boron nitride on said substrate facing said target,
   wherein a discharge of a gas comprising a nitrogen atom is formed between said target and said substrate; said substrate is at a temperature of from 300° to 1300° C.; and said laser has a power density of from 0.5 to 20 J/cm$^2$.

4. The method according to claim 3, wherein a deposition pressure is from $10^{-5}$ to 10 Torr.

5. The method according to claim 3, wherein said gas comprising the nitrogen atom is nitrogen gas or ammonia gas.

6. A method for producing a cubic boron nitride film on a substrate comprising irradiating an excimer laser on a target comprising boron atoms to deposit cubic boron nitride on said substrate facing said target, wherein nitrogen ions are irradiated on a surface of said substrate; said substrate is at a temperature of from 300° to 1300° C.; and said laser has a power density of from 0.5 to 20 J/cm$^2$.

7. The method according to claim 6, wherein a deposition pressure is from $10^{-5}$ to 10 Torr.

8. A method for producing a cubic boron nitride film on a substrate comprising irradiating an excimer laser on a target comprising boron atoms in an atmosphere containing a gas comprising nitrogen atoms to deposit cubic boron nitride on said substrate facing said target, wherein said substrate is at a temperature of from 300° to 1300° C.; a heated filament having a temperature of from 1700° to 2300° C.; is provided between said target and said substrate; and said laser has a power density of from 0.5 to 20 J/cm$^2$.

9. The method according to claim 8, wherein a gas comprising at least one element selected from the group consisting of hydrogen, fluorine and rare-gas elements is supplied between said target and said substrate.

10. The method according to claim 9, wherein said target contains hydrogen atoms and/or fluorine atoms.

11. A method for producing a cubic boron nitride film on a substrate comprising irradiating an excimer laser on a target comprising boron atoms in an atmosphere containing a gas comprising nitrogen atoms to deposit cubic boron nitride on a substrate facing said target, wherein a heated filament having a temperature of from 500° to 1700° C., is provided between said target and said substrate; a negative direct current voltage or a radio frequency voltage is applied to said filament; said substrate is at a temperature of from 300° to 1300° C.; and said laser has a power density of from 0.5 to 20 J/cm$^2$.

12. The method according to claim 11, wherein a gas comprising at least one element selected from the group consisting of hydrogen, fluorine and rare-gas elements is supplied between said target and said substrate.

13. The method according to claim 11, wherein said target contains hydrogen atoms and/or fluorine atoms.

* * * * *